US008115776B2

(12) United States Patent
Selbrede et al.

(10) Patent No.: US 8,115,776 B2
(45) Date of Patent: Feb. 14, 2012

(54) MECHANISM TO MITIGATE COLOR BREAKUP ARTIFACTS IN FIELD SEQUENTIAL COLOR DISPLAY SYSTEMS

(75) Inventors: Martin G. Selbrede, The Woodlands, TX (US); Rick Zemen, Austin, TX (US)

(73) Assignee: Rambus Inc., Sunnyvale, CA (US)

( * ) Notice: Subject to any disclaimer, the term of this patent is extended or adjusted under 35 U.S.C. 154(b) by 790 days.

(21) Appl. No.: 11/913,232

(22) PCT Filed: Aug. 1, 2006

(86) PCT No.: PCT/US2006/029795

§ 371 (c)(1),
(2), (4) Date: Oct. 31, 2007

(87) PCT Pub. No.: WO2007/016511

PCT Pub. Date: Feb. 8, 2007

(65) Prior Publication Data

US 2008/0192065 A1 Aug. 14, 2008

Related U.S. Application Data

(60) Provisional application No. 60/704,605, filed on Aug. 2, 2005.

(51) Int. Cl.

| | |
|---|---|
| ***G09G 5/10*** | (2006.01) |
| ***G09G 3/16*** | (2006.01) |
| ***G09G 3/30*** | (2006.01) |
| ***G06F 3/08*** | (2006.01) |
| ***H04N 9/04*** | (2006.01) |
| ***H04N 9/12*** | (2006.01) |
| ***H04N 5/74*** | (2006.01) |
| *H04N 1/46* | (2006.01) |
| *G06K 9/00* | (2006.01) |
| *G06K 9/40* | (2006.01) |
| *G06K 9/76* | (2006.01) |
| *G03F 3/08* | (2006.01) |
| *G02F 1/135* | (2006.01) |

(52) U.S. Cl. ............ 345/589; 345/48; 345/77; 345/213; 345/690; 348/269; 348/500; 348/742; 348/759; 349/25; 349/106; 358/509; 358/512; 358/518; 382/162; 382/167; 382/211; 382/274

(58) Field of Classification Search .............. 345/88–90, 345/426, 428, 581, 589, 619, 204, 207, 690–691, 345/213–214, 48, 77, 83–84; 348/68–70, 348/268–269, 500–503, 557, 742, 759; 349/1, 349/61–62, 104–106, 25, 31
See application file for complete search history.

(56) References Cited

U.S. PATENT DOCUMENTS 5,122,791 A 6/1992 Gibbons et al.

(Continued)

FOREIGN PATENT DOCUMENTS

WO 03/094138 11/2003

OTHER PUBLICATIONS

European Search Report for Application No. 06789020.2 mailed Jul. 27, 2009, 12 pages.

(Continued)

*Primary Examiner* — Wesner Sajous

(74) *Attorney, Agent, or Firm* — Renner, Otto, Boisselle & Sklar, LLP

(57) ABSTRACT

A mechanism for mitigating undesired color image breakup artifacts arising in display systems that exploit the principle of field sequential color generation. By suitably reducing the time interval during which image information strikes the moving retina, such that the differential position for the respective red, green, and blue components of the image falling upon the moving retina does not exceed the diameter of a retinal cone or rod, the cause of the breakup is negated and the image becomes unitary as expected: the eye sees the image as if all the components arrived at the same time. The truncation of light emission into shorter time frames necessitates a compensatory increase in imaging light intensity, such that the net amount of photonic flux striking the retina, averaged over time, remains unchanged. The mechanism can be applied to systems with discrete red, green, and blue sources as well as to color-wheel-based systems.

19 Claims, 11 Drawing Sheets

U.S. PATENT DOCUMENTS

| | | | | |
|---|---|---|---|---|
| 5,999,307 | A | 12/1999 | Whitehead et al. | |
| 6,348,907 | B1 | 2/2002 | Wood | |
| 6,392,620 | B1 | 5/2002 | Mizutani | |
| 6,535,187 | B1 | 3/2003 | Wood | |
| 7,755,582 | B2 * | 7/2010 | Hagood et al. | 345/84 |
| 7,927,654 | B2 * | 4/2011 | Hagood et al. | 427/164 |
| 2001/0043179 | A1 | 11/2001 | Yoshinaga | |
| 2002/0036828 | A1 * | 3/2002 | Wong | 359/585 |
| 2002/0101433 | A1 * | 8/2002 | McKnight | 345/589 |
| 2004/0246275 | A1 | 12/2004 | Yoshihara et al. | |
| 2005/0052388 | A1 * | 3/2005 | Handschy et al. | 345/89 |
| 2006/0145978 | A1 * | 7/2006 | Takatori et al. | 345/87 |
| 2007/0002267 | A1 * | 1/2007 | Mochizuki | 349/184 |
| 2007/0035707 | A1 * | 2/2007 | Margulis | 353/122 |
| 2007/0216617 | A1 * | 9/2007 | Handschy et al. | 345/84 |
| 2008/0037104 | A1 * | 2/2008 | Hagood et al. | 359/292 |
| 2008/0062500 | A1 * | 3/2008 | Hagood | 359/230 |
| 2008/0094426 | A1 * | 4/2008 | Kimpe | 345/691 |

OTHER PUBLICATIONS

Examination Report Issued for EP Application No. 06789020.2, dated Feb. 23, 2011, 5 pages (enclosed).

* cited by examiner

1100

| Light Intensity & Color | | | |
|---|---|---|---|
| Time (ms) | RED | GREEN | BLUE |
| 0.00 | 0 | 0 | 0 |
| 0.40 | 1 | 0 | 0 |
| 5.16 | 1 | 0 | 0 |
| 5.56 | 0 | 0 | 0 |
| 5.96 | 0 | 1 | 0 |
| 10.71 | 0 | 1 | 0 |
| 11.11 | 0 | 0 | 0 |
| 11.51 | 0 | 0 | 1 |
| 16.27 | 0 | 0 | 1 |
| 16.67 | 0 | 0 | 0 |
| 17.07 | 1 | 0 | 0 |
| 21.82 | 1 | 0 | 0 |
| 22.22 | 0 | 0 | 0 |
| 22.62 | 0 | 1 | 0 |
| 27.38 | 0 | 1 | 0 |
| 27.78 | 0 | 0 | 0 |
| 28.18 | 0 | 0 | 1 |
| 32.93 | 0 | 0 | 1 |
| 33.33 | 0 | 0 | 0 |
| 33.73 | 0 | 0 | 0 |

*FIG. 11A*

1201

Light Intensity & Color

| Time (ms) | RED | GREEN | BLUE |
|---|---|---|---|
| 0.00 | 0 | 0 | 0 |
| 0.05 | 12 | 0 | 0 |
| 0.41 | 12 | 0 | 0 |
| 0.46 | 0 | 0 | 0 |
| 0.51 | 0 | 12 | 0 |
| 0.88 | 0 | 12 | 0 |
| 0.93 | 0 | 0 | 0 |
| 0.98 | 0 | 0 | 12 |
| 1.34 | 0 | 0 | 12 |
| 1.39 | 0 | 0 | 0 |
| T.dark,=> | | | |
| 16.67 | 0 | 0 | 0 |
| 16.72 | 12 | 0 | 0 |
| 17.08 | 12 | 0 | 0 |
| 17.13 | 0 | 0 | 0 |
| 17.18 | 0 | 12 | 0 |
| 17.54 | 0 | 12 | 0 |
| 17.59 | 0 | 0 | 0 |
| 17.64 | 0 | 0 | 12 |
| 18.01 | 0 | 0 | 12 |
| 18.06 | 0 | 0 | 0 |
| T.dark,=> | | | |
| 33.80 | | | |

1202

1204

*FIG. 12C*

MECHANISM TO MITIGATE COLOR BREAKUP ARTIFACTS IN FIELD SEQUENTIAL COLOR DISPLAY SYSTEMS

TECHNICAL FIELD

The present invention relates in general to the field of display technologies in general, and more particularly to displays that utilize the principle of field sequential color to generate color information, whether in a projection-based system or a direct-view system.

BACKGROUND INFORMATION

Display systems (whether projection-based or direct-view) that use field sequential color techniques to generate color are known to exhibit highly undesirable visual artifacts easily perceived by the observer under certain circumstances. Field sequential color displays emit (for example) the red, green, and blue components of an image sequentially, rather than simultaneously, tied to a rapid refresh cycling time. If the frame rate is sufficiently high, and the observer's eyes are not moving relative to the screen (due to target tracking or other head/eye movement), the results are satisfactory and indistinguishable from video output generated by more conventional techniques (viz., that segregate colors spatially using red, green, and blue sub-pixels, rather than temporally as is done with field sequential color techniques).

However, in many display applications the observer's eye does partake of motion relative to the display screen (rotational motions of the eye in its socket, saccadic motions, translational head motions, etc.), such motions usually being correlated with target tracking (following an image on the display as it moves across the display surface). In the case of such image tracking, which involves oculomotor-driven rotation of the eye in its socket as the observer follows an object moving on the display screen, the object's component primary colors (red, green, and blue, for example) arrive at the observer's retina at different times. Even at a high frame rate of 60 frames per second, the red, green, and blue information from the display arrives at the retina 5.5 milliseconds apart. If the retina is in rotational motion, as would be the case if the observer were tracking an image (hereafter "target") that was moving across the display, the red, green, and blue information comprising the target would hit the retina at different places. A target that is gray in actual color will split into its separate red, green, and blue components distributed in overlap fashion along the path of retinal rotation. The faster the eye moves, the more severe the "image breakup," the decomposition of the individual colors comprising the target due to where those primary components strike the observer's retina. These visual artifacts have proven to be a barrier to the adoption of field sequential color displays in many critical applications, including video systems for training fighter pilots using flight simulation. A trainee in such a flight simulator needs to encounter an environment that matches reality closely, and a discontinuous smear of red, green, and blue ghost images that are not overlapped properly do not constitute an acceptably simulated target when the trainee is expecting to see the grey winged fuselage of an enemy fighter plane in the crosshairs.

The display system disclosed in U.S. Pat. No. 5,319,491, which is incorporated by reference in its entirety herein, as representative of a larger class of direct view field sequential color-based devices, illustrates the fundamental principles at play within such devices. Such a device is able to selectively frustrate the light undergoing total internal reflection within a (generally) planar waveguide. When such frustration occurs, the region of frustration constitutes a pixel suited to external control. Such pixels can be configured as a MEMS device, and more specifically as a parallel plate capacitor system that propels a deformable membrane between two different positions and/or shapes, one corresponding to a quiescent, inactive state where frustrated total internal reflection (FTIR) does not occur due to inadequate proximity of the membrane to the waveguide, and an active, coupled state where FTIR does occur due to adequate proximity, said two states corresponding to an off and on state for the pixel. A rectangular array of such MEMS-based pixel regions, which are often controlled by electrical/electronic means, is fabricated upon the top active surface of the planar waveguide. This aggregate MEMS-based structure, when suitably configured, functions as a video display capable of color generation by exploiting field sequential color and pulse width modulation techniques. Red, green, and blue light are sequentially inserted into the edge of the planar waveguide, and the pixels are opened or closed (activated or deactivated) appropriately, such that the duration of a pixel's being opened (activated) determines how much light is emitted from it, gray scale being determined by pulse width modulation.

Other direct view displays may use field sequential color techniques, but substitute amplitude modulation for pulse width modulation. For example, a monochromatic liquid crystal display with suitably fast switching times can be turned into a field sequential color display by replacing the white back light with a back light that can sequentially emit red, green, and blue light in sufficiently rapid succession. Liquid crystal pixels are variable opacity windows that modulate the amount of light passing through them by amplitude modulation rather than pulse width modulation. Undesirable visual artifacts arise for these systems as well, and for the same reason: the respective primary components of the image (target) fall on a moving retina at different places, causing the apparent breakup of the target as perceived.

Projection-based systems can also use field sequential color. The DLP (digital light processor) developed by Texas Instruments, Inc., employs a dense array of deformable micro-mirror structures that are used to create an image when red, green, and blue lights are directed onto them in rapid consecutive sequence. Light from activated micromirror pixels passes through a lens system and is focused on the final projection screen for viewing, while light striking inactive pixels are not sent through the lens system. Such systems tend to use pulse width modulation to generate gray scale. The red, green, and blue light being directed onto the micromirror array can be created either directly (with discrete red, green, and blue sources) or as the result of white light passing through a rotating color wheel composed of red, green, and blue filter segments. In either case, the undesirable artifacts are clearly visible on the image projected onto the display screen, for the same reason they appear in a direct view device: the respective red, green, and blue images do not fall on the moving retina at the same place, causing spatial decomposition and the resulting color breakup artifact.

Field sequential color displays bring many advantages to the display sector, whether one considers direct view displays (such as flat panel display systems) or projection-based systems. For example, in a flat panel display that uses conventional spatially-modulated color with red, green, and blue sub-pixels comprising an individual pixel, three control elements (usually thin film transistors) are required to separately control the red, green, and blue intensities from the pixel. A display with one million pixels would require three million transistors to drive it in color. The corresponding display using temporally-modulated color (field sequential color) needs only one thin film transistor per pixel, reducing the amount of transistors distributed over the display surface from three million to one million—an improvement that has significant implications for yield and production cost. Moreover, a field sequential color pixel can be much larger, since it fits in the area that would normally be occupied by three sub-pixels (red, green and blue), further improving production yield and reducing aperture drain (surface area on a display not given over to light emission). Conversely, this geometric advantage can be exploited to improve pixel densities without the heavy control overhead associated with standard sub-pixel-based architectures, yielding superior resolutions without exponential price increases. Accordingly, field sequential color displays have much to recommend them. But their utility in applications where color image breakup is unacceptable is sharply curtailed.

Therefore, there is a need in the art for a means to mitigate and suppress the color image breakup artifacts traditionally associated with displays that employ the principle of field sequential color generation, whether in a direct view or a projection-based system. A display device that enjoys the benefits of field sequential color operation without generating unacceptable motion artifacts would bring the benefits of field sequential architectures (direct view and projection-based) to bear on applications where those benefits are most needed, e.g., critical flight simulation display systems.

SUMMARY

The problems outlined above may at least in part be solved in one of several ways, depending on the inherent nature of the field sequential color display system in question (whether it is a direct view device or a projection-based device) and its gray scale generation methodology (pulse width modulation or amplitude modulation at the pixel level). Further distinctions may arise for a given system (e.g., a projection-based system may use discrete, individually controllable illumination sources to provide primary color light to the projection system, or may exploit a rotating color wheel through which white light is passed, the respective color filters on the wheel providing the desired primary colors to be modulated and then projected).

One artifact suppression technique that appears to dominate the existing art involves fabricating a feedback mechanism by which the head and/or eyes of the observer are positionally tracked, and compensatory adjustments to the sequentially displayed primary colors (usually red, green, and blue) are made so that the subcomponents of the color image all fall on the identical region of the retina. Such a system is clearly not self-contained, and is limited by the accuracy of head/eye tracking technology and the ability for computer software to properly predict where the next primary subframe should be displayed on a moving target (the observer's retinas). A self-contained system, where no extraneous hardware or tracking mechanisms are necessary, would be far more valuable and easier to realize. The present invention provides exactly such a self-contained system, where artifact suppression is realized in the display system itself.

The retina of the human eye does not actually provide infinitesimally continuous imaging (despite subjective perceptions to the contrary). The eye itself has finite resolving power limited by the area occupied by any one of its multitude of highly-tuned light receptors (the cones and rods of the retina). If a color image is decomposed into its primary components (e.g., red, green, and blue subframes) that are sequentially displayed, and these image components fall on the same location of the retina (within the limit of the size of a rod or cone), the subframes will be perceived to properly overlap and no color image breakup will be perceived. The resulting image will be unitary. Given the inherent limitations of oculomotor rotation of the eye even during saccadic motion (an upper limit of 700 degrees of arc per second), and the approximate size of retinal rods and cones, it is possible to determine how long the window of opportunity actually is to display primary colors and have them satisfy the temporal criterion set forth above. Truncation of primary propagation entails a minimal duration for all primaries of 4 milliseconds for any given frame (followed by no image information at all until the next frame begins), and a preferred duration for all primaries of as short as one millisecond.

In the case of a 60 frame per second system using red, green, and blue primaries, a conventional display system would divide a frame into three equal parts, one apportioned to each primary color. In such an instance, a frame lasts 16.6 milliseconds, and each primary color occupies a third of this total frame, or 5.5 milliseconds. But the present invention teaches the global modification of this strategy. For example, to achieve time truncation of 3 milliseconds for all color information, the red, green, and blue primaries would each bear duration of only 1 millisecond (not 5.5). They would fall one after the other without interposed delays, and then be followed by 13.6 milliseconds of black (no imaging data), thus totaling 16.6 milliseconds. In this way, the red, green, and blue information comprising the image arrives at the retina in the same location, despite any rotation of the retina to track or follow objects being displayed in the program video content being displayed.

In the example provided, it is insufficient to merely truncate the signals from 5.5 milliseconds per primary to 1 millisecond (assuming a 3 millisecond total truncation). By reducing the time by a factor of 5.5 (from 5.5 milliseconds to 1 millisecond), the perceived intensity of light falling on the retina has been reduced by the same amount. It is therefore needful to increase the intensity of the light source being modulated to compensate for the shortened time available to generate an image. In the example provided, this would require an increase in light intensity of 5.5 times base intensity so that the average amount of photons received during the frame is unchanged whether the present invention is invoked in a display system or not. This energy need only be dissipated during the 3 milliseconds it is needed, so that average energy consumption is equivalent under either scenario (with or without the present invention implemented).

The implementation of the present invention therefore has several prerequisites. The individual pixels that modulate the light are capable of generating gray scale accurately despite having a significantly shorter time in which to operate. The light sources are capable of more rapid cycling, followed by a long quiescent period between consecutive frames, and they are capable of reliably delivering much higher intensity lights, albeit in a shortened duty cycle marked by extended periods between frames where no light is required.

The foregoing principles have a straightforward implementation path for direct view displays, whether they use amplitude modulated or pulse width modulated gray scale generation. For projection-based display systems that utilize discrete light sources for the respective primaries, this adaptation is equally transparent. However, projection-based systems that use rotating color wheels to acquire primary colors by filtering a white illumination source require a different strategy for implementation of the present invention. The foundational principles are nonetheless analogous.

A conventional color wheel usually divides its area into equal segments apportioned to each desired primary color. The most common configuration is a color wheel comprised of red, green, and blue filters. Each color filter takes up 120 degrees of arc (the circle of the color wheel divided into three even segments). As the color wheel spins, it provides red, green, and blue light in rapid sequential succession. Images produced using such a wheel is subject to color image breakup as documented earlier. The color wheel is modified to implement the present invention.

In a modified color wheel using the example above, the red, green, and blue segments no longer proscribe equal segments of 120 degrees each, but a much smaller "slice" of the wheel. Three thinner slices (e.g., at 24 degrees each), one for red, one for green, and one for blue, are placed in close proximity, while the remainder of the color wheel (108 degrees) is made opaque. The white illumination source is intensity corrected (in this case, since the available illumination time is reduced by a factor of five, the intensity of the illumination source is increased by the same factor). The illumination source should preferably shut down to conserve energy when it would otherwise be directing light uselessly at the opaque part of the modified color wheel during its uniform rotation.

Additional refinements to the base invention can be implemented. It has been assumed that the truncated primary are synchronously distributed (the leading edge of each consecutive primary is equally spaced apart in time). In the example given above for a 3 millisecond total color pulse composed of consecutive red, green, and blue primaries, we may find red starting at t=0 (leading of global frame), green starting at t=1 millisecond (right after red has shut down), and blue starting at t=2 milliseconds (right after green has shut down), followed by 13.6 seconds of quiescence (black) before the next global frame begins (assuming a rate of 60 frames per second). However, such rigid structuring of start times might only be necessary when program content requires it, and a mechanism to make such a determination allows the present invention to further effect temporal truncation of image generation.

The foregoing has outlined rather broadly the features and technical advantages of one or more embodiments of the present invention in order that the detailed description of embodiments of the present invention that follows may be better understood. Additional features and advantages of embodiments of the present invention will be described hereinafter which form the subject of the claims.

BRIEF DESCRIPTION OF THE DRAWINGS

A better understanding of the present invention can be obtained when the following detailed description is considered in conjunction with the following drawings, in which:

FIG. 11A illustrates a table of light intensity values as a function of time for each of the three colors for the prior art system shown in FIG. 10A in accordance with an embodiment of the present invention;

FIG. 12C illustrates the associated table of light intensity versus time in accordance with an embodiment of the present invention.

DETAILED DESCRIPTION

In the following description, numerous specific details are set forth to provide a thorough understanding of the present invention. However, it will be apparent to those skilled in the art that the present invention may be practiced without such specific details. In other instances, components have been shown in generalized form in order not to obscure the present invention in unnecessary detail. For the most part, details concerning considerations of how a given display using field sequential color generation techniques actually creates and displays images on its surface have been omitted inasmuch as such details are not necessary to obtain a complete understanding of the present invention and, while within the skills of persons of ordinary skill in the relevant art, are not directly relevant to the utility and value provided by the present invention.

The principles of operation to be disclosed immediately below assume the desirability of removing field sequential color artifacts in displays that temporally segregate the primary color components of a given image and present each frame of video information by rapid consecutive generation of each primary component. Such artifacts are understood to arise when the primary components making up a composite frame of video information do not all reach the same region of the observer's retina due to relative motion of the retina and the displayed image (or part of an image, viz., a putative target being displayed).

Among the technologies (flat panel display or other candidate technologies that exploit the principle of field sequential color generation) that lend themselves to implementation of the present invention is the flat panel display disclosed in U.S. Pat. No. 5,319,491, which is hereby incorporated herein by reference in its entirety. The use of a representative flat panel display example throughout this detailed description shall not be construed to limit the applicability of the present invention to that field of use, but is intended for illustrative purposes as touching the matter of deployment of the present invention. Furthermore, the use of the three tristimulus primary colors (red, green, and blue) throughout the remainder of this detailed description is likewise intended for illustrative purposes, and shall not be construed to limit the applicability of the present invention to these primary colors solely, whether as to their number or color or other attribute.

Figure 3:
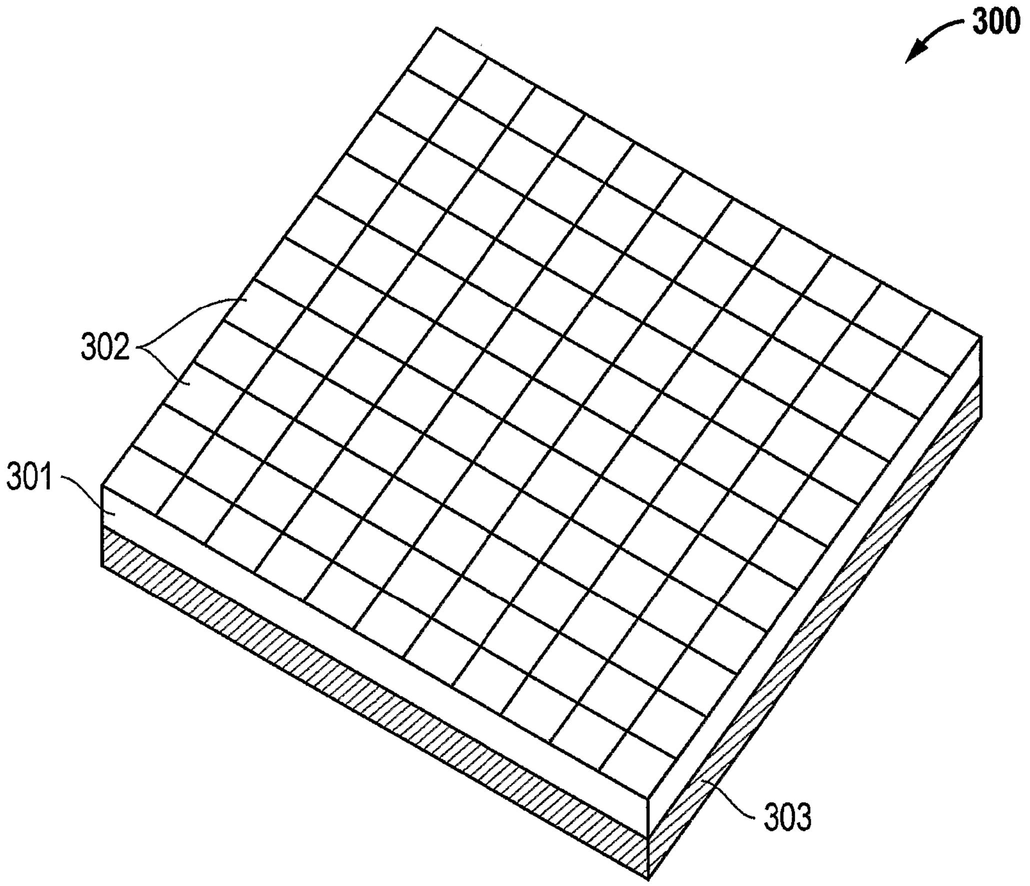
FIG. 3 illustrates a perspective view of a direct view flat panel display suitable for implementation of the present invention.

Such a representative flat panel display may comprise a matrix of optical shutters commonly referred to as pixels or picture elements as illustrated in FIG. 3. FIG. 3 illustrates a simplified depiction of a flat panel display 300 comprised of a light guidance substrate 301 which may further include a flat panel matrix of pixels 302. Behind the light guidance substrate 301 and in a parallel relationship with substrate 301 may be a transparent (e.g., glass, plastic, etc.) substrate 303. It is noted that flat panel display 300 may include other elements than illustrated such as a light source, an opaque throat, an opaque backing layer, a reflector, and tubular lamps, as disclosed in U.S. Pat. No. 5,319,491.

Figure 4A:
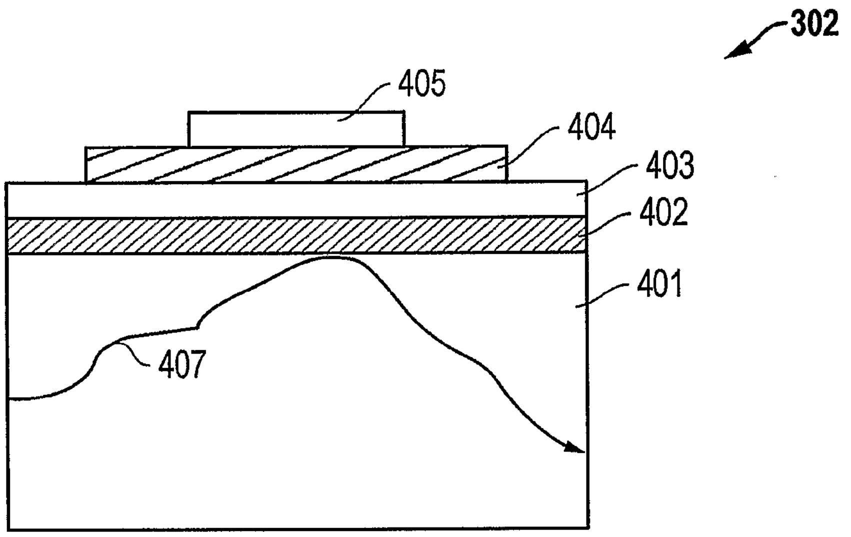
FIG. 4A illustrates a side view of a pixel in a deactivated state in accordance with an embodiment of the flat panel display of FIG. 3.
Figure 4B:
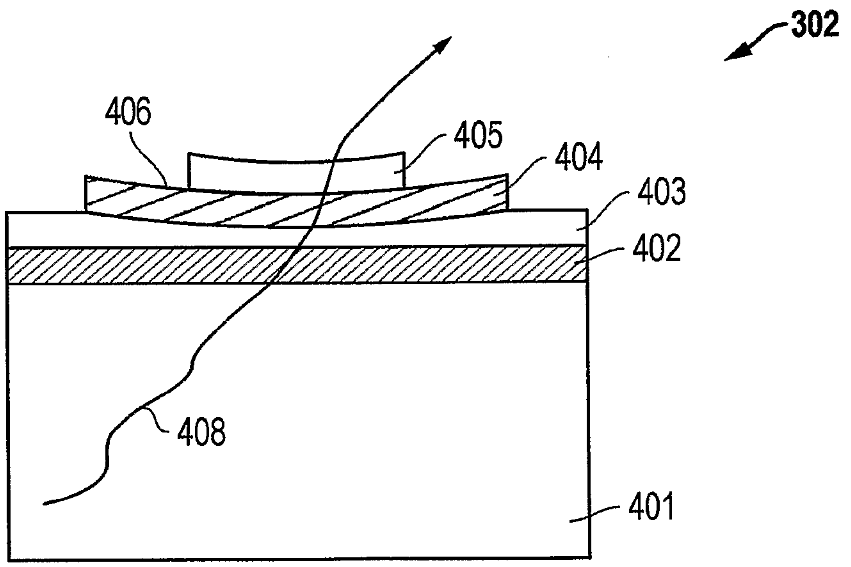
FIG. 4B illustrates a side view of a pixel in an activated state in accordance with an embodiment of the flat panel display of FIG. 3.

Each pixel 302, as illustrated in FIGS. 4A and 4B, may include a light guidance substrate 401, a ground plane 402, a deformable elastomer layer 403, and a transparent electrode 404.

Pixel 302 may further include a transparent element shown for convenience of description as disk 405 (but not limited to a disk shape), disposed on the top surface of electrode 404, and formed of high-refractive index material, preferably the same material as comprises light guidance substrate 401.

In this particular embodiment, it is necessary that the distance between light guidance substrate 401 and disk 405 be controlled very accurately. In particular, it has been found that in the quiescent state, the distance between light guidance substrate 401 and disk 405 should be approximately 1.5 times the wavelength of the guided light, but in any event this distance is greater than one wavelength. Thus the relative thicknesses of ground plane 402, deformable elastomer layer 403, and electrode 404 are adjusted accordingly. In the active state, disk 405 is pulled by capacitative action, as discussed below, to a distance of less than one wavelength from the top surface of light guidance substrate 401.

In operation, pixel 302 exploits an evanescent coupling effect, whereby TIR (Total Internal Reflection) is violated at pixel 302 by modifying the geometry of deformable elastomer layer 403 such that, under the capacitative attraction effect, a concavity 406 results (which can be seen in FIG. 4B). This resulting concavity 406 brings disk 405 within the limit of the light guidance substrate's evanescent field (generally extending outward from the light guidance substrate 401 up to one wavelength in distance). The electromagnetic wave nature of light causes the light to "jump" the intervening low-refractive-index cladding, i.e., deformable elastomer layer 403, across to the coupling disk 405 attached to the electrostatically-actuated dynamic concavity 406, thus defeating the guidance condition and TIR. Light ray 407 (shown in FIG. 4A) indicates the quiescent, light guiding state. Light ray 408 (shown in FIG. 4B) indicates the active state wherein light is coupled out of light guidance substrate 401.

The distance between electrode 404 and ground plane 402 may be extremely small, e.g., 1 micrometer, and occupied by deformable layer 403 such as a thin deposition of room temperature vulcanizing silicone. While the voltage is small, the electric field between the parallel plates of the capacitor (in effect, electrode 404 and ground plane 402 form a parallel plate capacitor) is high enough to impose a deforming force on the vulcanizing silicone thereby deforming elastomer layer 403 as illustrated in FIG. 4B. By compressing the vulcanizing silicone to an appropriate fraction, light that is guided within guided substrate 401 will strike the deformation at an angle of incidence greater than the critical angle for the refractive indices present and will couple light out of the substrate 401 through electrode 404 and disk 405.

The electric field between the parallel plates of the capacitor may be controlled by the charging and discharging of the capacitor which effectively causes the attraction between electrode 404 and ground plane 402. By charging the capacitor, the strength of the electrostatic forces between the plates increases thereby deforming elastomer layer 403 to couple light out of the substrate 401 through electrode 404 and disk 405 as illustrated in FIG. 4B. By discharging the capacitor, elastomer layer 403 returns to its original geometric shape thereby ceasing the coupling of light out of light guidance substrate 401 as illustrated in FIG. 4A.

Figure 5:
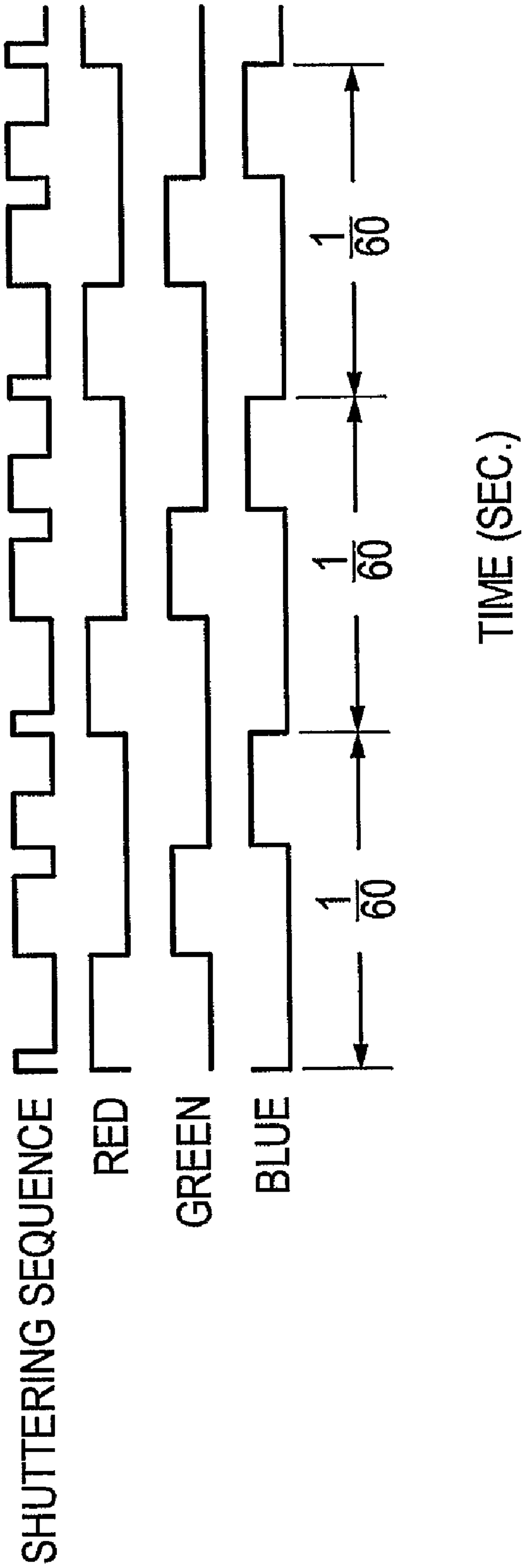
FIG. 5 illustrates a representative timing diagram for generating field sequential color as used in the flat panel display of FIG. 3 in accordance with an embodiment of the present invention.

The display used to illustrate conventional, unadjusted implementation of field sequential color generation techniques operates according to the representative pattern disclosed in FIG. 5. The three tristimulus primaries, red, green, and blue, are inserted from appropriate light sources into the planar waveguide in sequential succession as indicated in FIG. 5. Each individual pixel is opened or closed according to a determinate shuttering sequence, as shown in FIG. 5, that is referenced to the amount of red, green, or blue light to be emitted during a given video frame from the pixel in question (with each pixel being independently controlled). Such a system as disclosed in FIG. 3 and further explicated in FIG. 5 utilizes pulse width modulation to generate gray scale values, but it should be understood that the present invention is no less applicable to field sequential color systems that incorporate amplitude modulation (differential opacity) to achieve gray scale at the pixel level.

As stated in the Background Information section, certain field sequential color displays, such as the one in FIG. 3, exhibit undesirable visual artifacts under certain viewing conditions and video content. The cause of such harmful artifacts proceeds from relative motion of the observer's retina and the individual primary components of a given video frame during the successive transmission in time of each respective sub-frame primary component. Such artifacts, whether arising in direct view systems or projection-based field sequential color displays, militate against the use of such color generation strategies in many critical application spaces, most notably flight simulation systems where target acquisition may become impossible due to image breakup. A mechanism to reduce or effectively suppress such artifacts in display systems that exploit the principle of field sequential color is needed.

The device of FIG. 3, based on a color generation schema as illustrated in FIG. 5, serves as a pertinent example that will be used, with some modifications for the purpose of generalization, throughout this disclosure to illustrate the operative principles in question. It should be understood that this example, proceeding from U.S. Pat. No. 5,319,491, is provided for illustrative purposes as a member of a class of valid candidate applications and implementations, and that any device, comprised of any system exploiting the principles that inhere in field sequential color generation, can be enhanced with respect to artifact reduction or suppression where said artifacts stem from the primary components comprising a video frame falling on different geometric regions of the observer's retina due to relative motion of retina and display. The present invention governs a mechanism for expunging the source of said color image breakup artifacts for a large family of devices that meet certain specific operational criteria regarding the implementation of field sequential color generation principles, while the specific reduction to practice of any particular device being so enhanced imposes no restriction on the ability of the present invention to enhance the behavior of the device.

Figure 1:
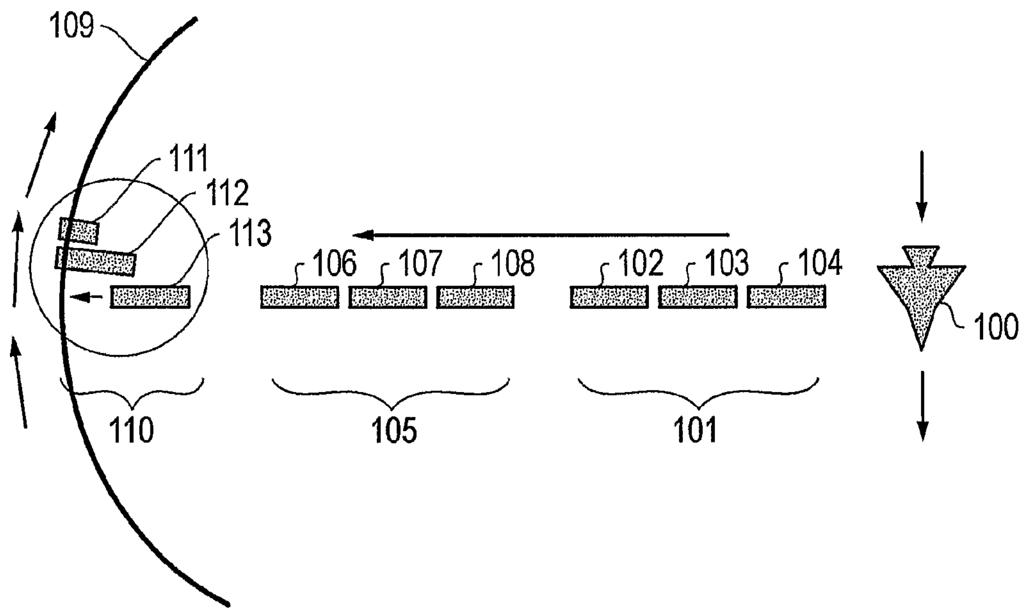
FIG. 1 illustrates what causes the phenomenon of color image breakup when an observer views an image generated using field sequential color generation techniques during rotational motion of the observer's eye in accordance with an embodiment of the present invention.

FIG. 1 illustrates in accordance with an embodiment of the present invention the general phenomenon of color image breakup in field sequential color displays. The information being displayed on the display surface during a given video frame 100 proceeds to the observer's retina 109 as a series of collinear pulses (e.g., 101 and 105) comprised of the respective consecutively-generated primary information constituting each video frame. So video frame information for frame 101 is composed of temporally separated primaries 102, 103, and 104, while the video frame one frame prior in time to frame 101 (i.e., 105) is likewise composed of temporally separated primaries 106, 107, and 108. The information contained as an array of pulse width modulated colored light for each primary color arrives at the retina 109 to form an image. If the primary subcomponents 106, 107, and 108 arrive at the same location on the retina, the eye will merge the primaries and perceive a composite image without any color breakup. However, if the retina 109 is in rotational motion, then the phenomenon at the retina follows the pattern of video frame 110, where the individual primary components 111, 112, and 113 fall on different parts of the retina, causing the artifact to be perceptible.

Figure 2A:
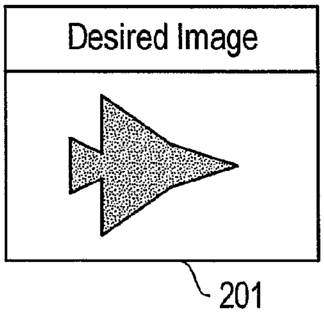
FIG. 2A illustrates the perceived image that is desired irrespective of eye rotation and/or other motion in accordance with an embodiment of the present invention.
Figure 2B:
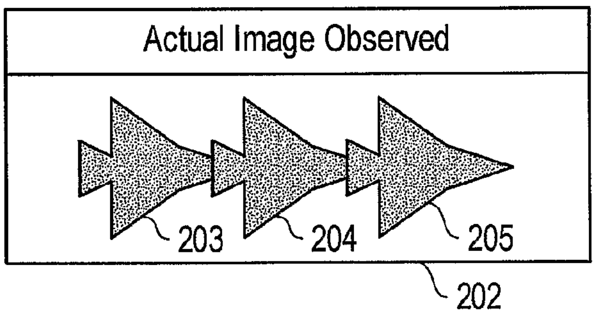
FIG. 2B illustrates the actual perceived image due to eye rotation and/or other motion in accordance with an embodiment of the present invention.

In FIG. 2, the intended versus actual perceived results are depicted in accordance with an embodiment of the present invention. For example, if the primary components comprising video frame 110 all arrived at the same location on the retina, the eye would merge the primary subframes to accurately form the composite image 201, which in this example is an image of a gray airplane. However, if the eye is in rotational motion, retina 109 moves with respect to the consecutive primaries comprising video frame 110, such that 111, 112, and 113 (the primary components comprising the entire frame 110) fall at different locations on retina 109, resulting in the perceived image 202, where the separate primary components 203, 204, and 205 are perceived no longer as fully overlapping, but rather distributed across the field of view in a dissociated form, as shown. Recovery of the intended image 201 is the goal of artifact suppression, whereby the splayed, dissociated image 202 is reduced or suppressed by virtue of extirpation of the cause of such dissociation.

Figure 6:
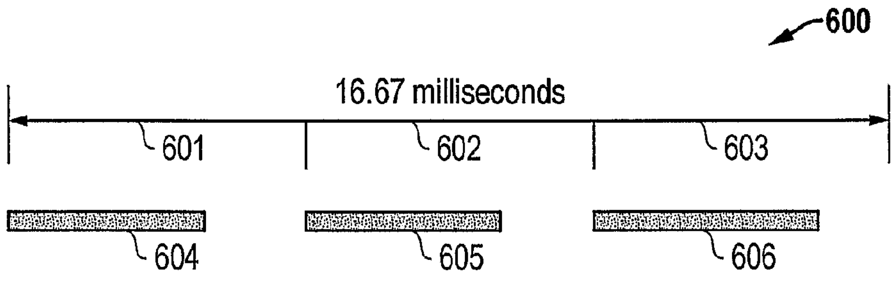
FIG. 6 illustrates an unadjusted representative sequencing schema for achieving field sequential color generation at a conventional video frame rate in accordance with an embodiment of the present invention.

FIG. 6 illustrates in accordance with an embodiment of the present invention unadjusted synchronous behavior of field sequential color display systems, using a representative frame rate of 60 frames of video information per second. A single frame 600 is 16.67 milliseconds in duration, and in a synchronous schema is subdivided equally by the number of primaries in use. In the representative example chose, the common tristimulus colors red, green, and blue, are employed. Three equal subdivisions of video frame 600 (601, 602, and 603) occur in consecutive succession, and each pixel within the display array generates and displays the appropriate level of gray scale during the available time window (red information 604 is displayed starting at the leading edge of time period 601, green information 605 during time period 602, and blue information 606 during time period 603. The leading edge of each consecutive burst of primary color light is equally spaced apart in time, thereby leading to this self-evident synchronous (clock-bound) behavior. (Temporally, the leading edge is signified by the left side of the time blocks). The amount of time it takes to display the video frame (up to the maximum of 16.67 milliseconds, the duration of the total video frame 600) is sufficiently large that artifacts due to color image breakup can occur during relative motion of the retina with respect to the display generating the color image.

Figure 7:
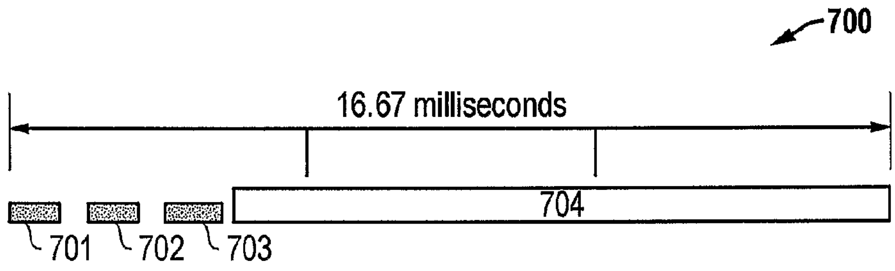
FIG. 7 illustrates an embodiment of the present invention that synchronously truncates in time the consecutive primary components of the displayed image to reduce and/or effectively suppress the phenomenon of color image breakup by virtue of the respective primary images falling on a geometric portion of the retina more closely approximating the imaging behavior of non-field sequential color displays.

FIG. 7 illustrates the first embodiment of artifact reduction and suppression as taught under the present invention, whereby the total frame duration 700 is no different than the unadjusted case (video frame 600), but the distribution of light energy over time is altered. Vastly shorter durations of primary light (701, 702, and 703) are emitted by the display. An intensity compensating mechanism is required to achieve equivalent image brightness, such that for identical program content being displayed in FIG. 6 and FIG. 7, the ratio of pulse width duration (604 divided by 701) is the factor by which the intensity of 701 is increased to ensure that the equivalent amount of light over time is received at the retina in both cases; the same adjustment is made to 702 and 703 as well (hereafter assumed as applying to all primaries without requiring explicit restatement for each individual primary color). In FIG. 7, the primary components 701, 702, and 703 are synchronous, insofar as the leading edge of 703 lags the leading edge of 702 by the same amount that the leading edge of 702 lags the leading edge of 701. A long quiescent period without light emission 704 fills the remainder of the video frame 700. As a consequence, depending on the frame rate, eye motion, and ratio of duration 704 to duration 700, image breakup artifacts can be either reduced or fully suppressed (imperceptible to the observer). Maximizing 704 with respect to 700, within the operability limitations of a given display technology, yields the most robust reduction and/or suppression of image breakup artifacts.

Figure 8:
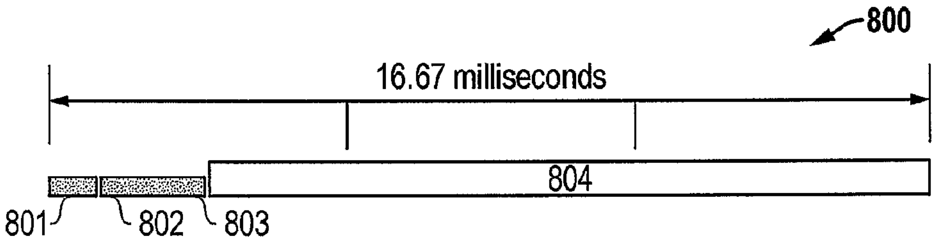
FIG. 8 illustrates an embodiment of the present invention that asynchronously truncates in time the consecutive primary components of the displayed image to further reduce and/or effectively suppress the phenomenon of color image breakup by virtue of the respective primary images falling on a geometric portion of the retina more closely approximating the imaging behavior of non-field sequential color displays, said truncation being determined by each consecutive frame's image content and aggregate primary color quantitation.

FIG. 8 depicts an asynchronous embodiment of the mechanism of FIG. 7, whereby the leading edge of each consecutive primary color is not determined by strict adherence to an underlying governing clock cycle but rather by program content. If program content contains 100% of each of the primary colors for every video frame displayed, there will be no difference between this embodiment and that depicted in FIG. 7. However, if there is less than 100% of any of the primary colors, then the leading edge of each successive primary color can be tied to the preceding trailing edge. For example, if program content contains 80% content of red, then at the end of the red subframe 801 (which represents 80% of the synchronous time 701 available to display the red subframe), the system can immediately trigger the beginning of the next primary subframe (in this example, the green subframe 802) rather than wait for the clocked signal to begin the next subframe (as is the case in FIG. 7, where a notable time gap occurs between red pulse 701 and green pulse 702). Such time gaps are closed in the asynchronous mechanism of FIG. 8, where such quiescent time is no longer situated between primary color subframes but rather fully allocated to a the single large block of quiescent inactivity 804. A mechanism for sampling, in real time, the primary components comprising each consecutive video frame being displayed is used, in turn, to determine the correct start and stop points for each primary color so as to maximize the ratio of quiescent duration 804 to the overall fixed frame rate 800. Where program content does not permit such asynchronous redistribution of the primary signals (e.g., there is at least one pixel displaying all primaries at all times, that is, a white pixel within the image), the default operational mode reverts to that disclosed in FIG. 7.

Figure 9:
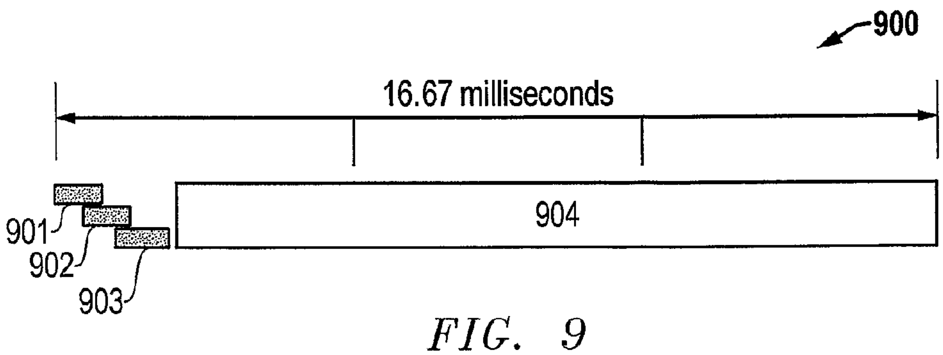
FIG. 9 illustrates an embodiment of the present invention where each consecutive frame's image content and aggregate primary color quantitation is analyzed in real time, whereby the image is re-encoded to maximize use of temporally-overlapped primaries to further reduce and/or effectively suppress the phenomenon of color image breakup by virtue of the respective primary images falling on a geometric portion of the retina more closely approximating the imaging behavior of non-field sequential color displays.

A further embodiment of the present invention is disclosed in FIG. 9, whereby the ratio of the quiescent period 904 to the overall video frame duration 900 is further increased by overlapping, where possible, the primary colors and re-encoding the frame rate to take advantage of such overlaps. Each video frame is individually sampled to determine feasibility of such primary color overlaps, and such determinations are unique to each video frame, requiring a real-time mechanism to assess and apply such video data acquisition and associated re-encoding of the signal. In the example provided, it is assumed that there is not only red information (901) and green information (902) but also enough yellow information (the color that results when red and green are simultaneously displayed) to permit the primaries to be overlapped to create a "virtual frame" of yellow. This embodiment requires the identification of all pixels with yellow content, the re-encoding of such yellow content (up to the maximum feasible within the frame) and the readjustment of all video content utilizing red and green, such that the final displayed result is no different than that to be obtained had the original embodiment of FIG. 7 been deployed.

By the same token, real time analysis of a given video frame may exhibit the potential to overlap the next pair of primary colors (902 and 903). In the example provided, green and blue can be simultaneously emitted to form cyan. The mechanism then determines cyan content for the video frame and re-encodes the frame to accommodate the presence of cyan to be either pulse-width or amplitude modulated to create cyan gray scale. In any case, the resulting image after data acquisition and re-encoding is to be no different in color than achieved in FIG. 7, except that the ratio of quiescent duration 904 to overall video frame duration 900 is larger than in the case of FIG. 7. If a given video frame contains at least one pixel containing only one pure primary at 100% intensity, this embodiment defaults to the operational pattern of FIG. 7 and there can be no occasion to overlap the primaries, since such overlap would bar proper color generation when program content contains at least one pixel displaying each primary color, and only that primary color, at 100% intensity. In any event, the intensity compensation mechanism for the embodiment of FIG. 9 is identical to that used in FIG. 8 and FIG. 7. The incremental improvement, based on program content, achieved by the embodiments of FIG. 8 and FIG. 9, allow the present invention to deliver augmented performance benefits. The vast majority of images recorded in the real world (versus generated by a computer) exhibit considerable proclivity for such enhanced truncation, since pure maximum-intensity tristimulus primaries rarely appear simultaneously in nature or man-made objects (and thus in video images recording them for playback).

The other embodiment of the present invention provides a method for mitigating image breakup in displays where a color wheel filter is used to create a plurality of primary colors from a white light source.

The rotating color wheel is used to create a consistently timed cycle of light emissions, such that for each frame, a plurality of primary colors are made available, each at a different time within the cycle. Gray scaling of each component color is accomplished, as is known to one schooled in the art, by a means of pulse width modulation.

Figure 10B:
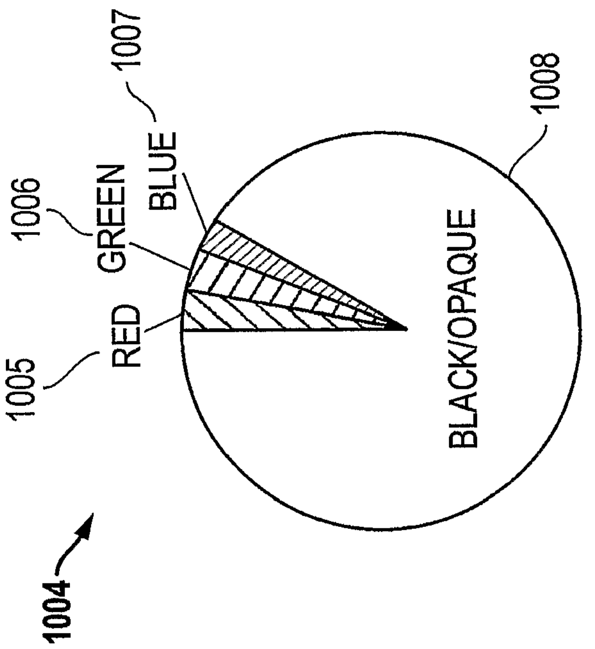
FIG. 10B illustrates an embodiment of the present invention of a color wheel filter where three colors are compressed into a small angular portion of the total area of the color wheel.
Figure 10A:
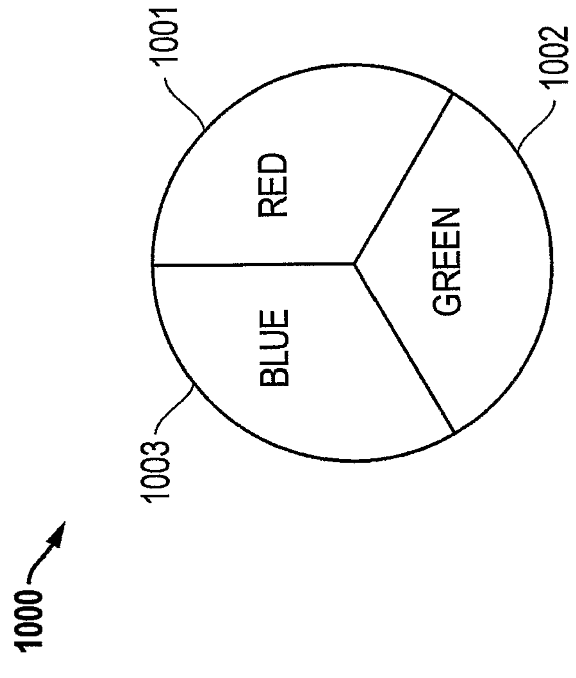
FIG. 10A (Prior Art)
FIG. 10A illustrates a prior art color wheel filter for use in pulse width modulated display systems.

An example of prior art of such a color wheel filter is shown in FIG. 10A, wherein the wheel 1000 is evenly divided into three segments and the primary colors are red 1001, green 1002 and blue 1003. Each color occupies an equal amount of the wheel; hence each delivers an equal amount of light emission during one cycle. As described previously in the emissive embodiments, the time span over which these different colors are delivered is long enough to create the image breakup artifacts when the mechanism and geometry of such a color wheel determines the resulting color timing cycle.

The present invention provides for a solution to eliminate said artifacts, wherein the duration of the light emission for a given cycle is abbreviated and a portion of the cycle becomes a dark phase, i.e. has no light emission. This embodiment provides a color wheel filter that is comprised of a plurality of primary colors, but that also includes an element that creates a significant span of dark time within the cycle, during which no light is emitted. The size of this opaque portion of the wheel shall be chosen advantageously to accommodate the timing and associated properties of the components and system that drive light emission from each pixel. In particular, a critical driver for the size of the opaque region will be the available white light intensity—the decrease in emission time created by the smaller color portion of the color wheel may be a component of the present invention, but it naturally carries with it the need for a correspondingly greater intensity of the light source so that the aggregate light energy delivered to the retina, over that shorter time, is equivalent to that which would have been delivered by the prior art color wheel 1000 over a longer emission time. In fact, the area ratio of opaque to colored on the color wheel 1004 will generally be proportional to the factor by which the present invention's white light intensity is greater than the prior art's white light intensity.

The remaining emissive portion of said color wheel is evenly divided among the primary colors so as to deliver each color for an equal time span per cycle, but the sum of said component time spans is significantly shorter than the full cycle.

An embodiment of the present invention of a color wheel filter where three colors are compressed into a small angular portion of the total area of the color wheel is illustrated in FIG. 10B. Referring to FIG. 10B, the wheel 1004 comprises three primary color filter segments and one opaque segment. In this embodiment, the three primary colors are red 1005, green 1006 and blue 1007, with the opaque segment shown as black 1008. Said wheel rotates in such a way as to advantageously first filter, and then block a white light source in a sequential manner that provides equal time spans of each color of light, said spans together comprising an emissive fraction of one cycle. The opaque segment 1009 causes the light emission to be interrupted and a corresponding dark portion of the cycle to exist between the aforementioned emissive portions of successive cycles.

Figure 11B:
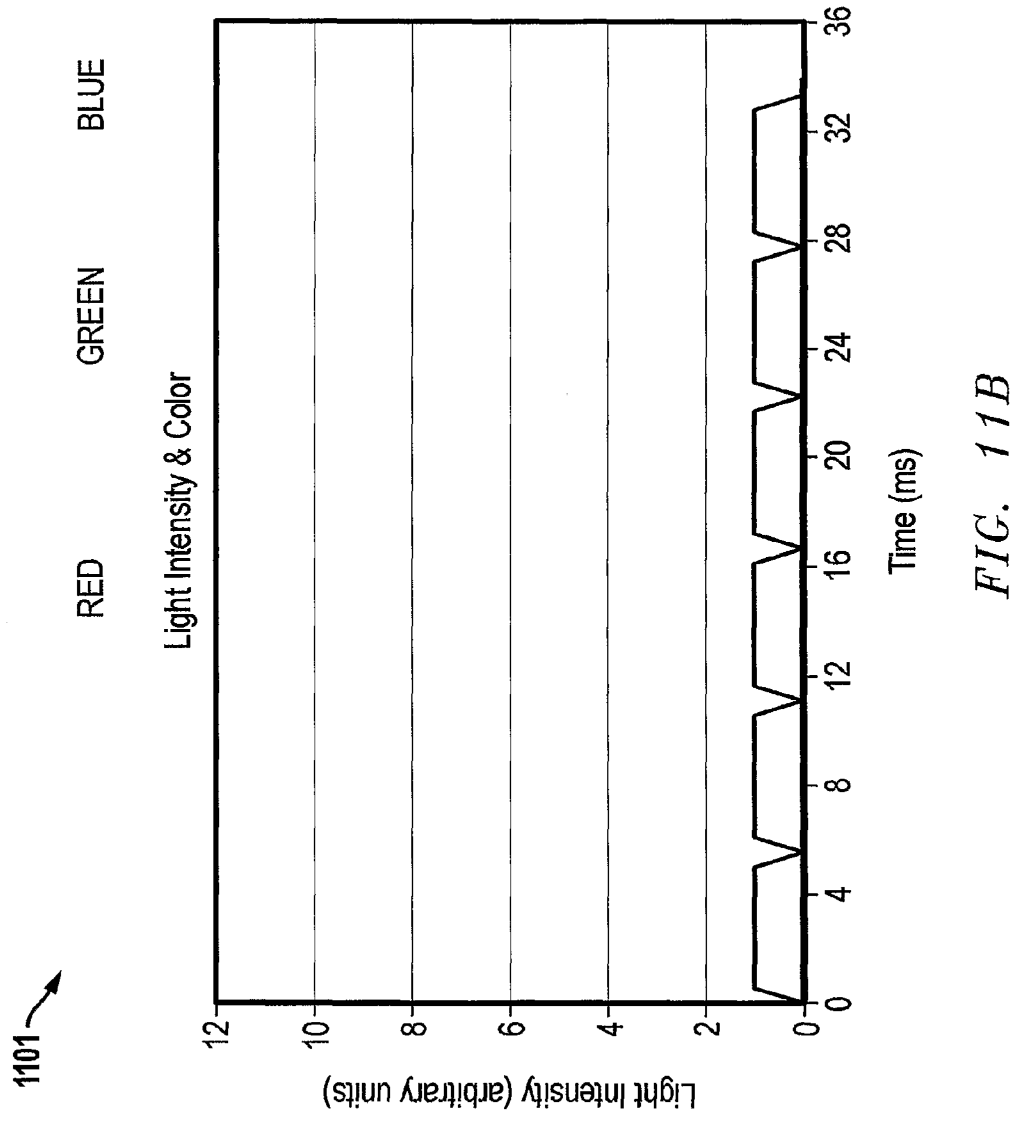
FIG. 11B illustrates a diagram of light intensity versus time over two cycles, with each of the three colors shown in sequence, each being five and two-thirds milliseconds in duration in accordance with an embodiment of the present invention.

The light output from the two aforementioned color wheel filters, shown in FIG. 10A and FIG. 10B, is different in significant ways, as will be apparent to one schooled in the art. Certain advantageous aspects of these differences will be disclosed in detail in the following figures. An example of light output from the prior art wheel 1000 in FIG. 10A is represented in a tabular fashion in FIG. 11A by table 1100. Said light output is plotted in FIG. 11B, with all three colors shown in sequence on the graph 1101, as they would be delivered from the output of the wheel. This follows directly from the previous art, as shown clearly in the relevant diagram, FIG. 14, of U.S. Pat. No. 5,319,491, as specified and previously incorporated by reference. Said diagram includes optical output shown graphically as three separate output lines, one for each of the component colors, for the purpose of describing how a shuttering mechanism could be implemented to accomplish pulse width modulation in the aggregate output emission, thereby creating a desired mix of component colors within a given frame to deliver one of the possible 4,913 output colors said embodiment provides. The graph 1101 in FIG. 11B is analogous to the aggregate of the three aforementioned separate color lines in the cited U.S. Pat. No. 5,319,491, shown superimposed as one output. In said previous art, three full color cycles are shown.

Table 1100 and diagram 1101 show light output delivered by the wheel 1000 over two full cycles. Thus the repetitive aspect of the process is shown, and an important distinction is illustrated, namely that from the start of each cycle, the separation in time of the start of the first color to the start of the subsequent two colors is, respectively, one third, and two thirds, of the cycle's total duration. In numerical terms, said separation in time is 5⅔ milliseconds (ms) from red to green, and 11⅓ ms from red to blue. Therefore, even if the system were run with a higher maximum intensity and the duration reduced for each color's emission within a cycle, thereby realizing the same overall light output in a shorter time, the fundamental nature of this color wheel's design determines the aforementioned separation time between each color's start. Since this separation time is determined by the geometry 1000 shown, said separation may not be reduced, and the associated artifact resulting from said separation is likely to be present.

Two details of note, first the cycle time inferred by the times used to make up each cycle in this and the following diagrams corresponds to 60 Hz, as is common in the United States, wherein the cycle duration is 16⅔ milliseconds (ms). Similarly, a transition time both for OFF to ON, and for ON to OFF, for each light emission is inferred in the table and likewise in the associated graph, both for this and the following diagrams. As long as said transition time is not longer than a given color's intended emission time within a cycle, it is not material. As will become apparent in the next figures, the comparative duration of each color's emission time will be much shorter in the present invention than in the aforementioned previous art, but, as those schooled in the art will appreciate, said duration will not be so short as to make reasonably attainable transition times a hindrance in achieving the benefits of the present invention.

Figure 12A:
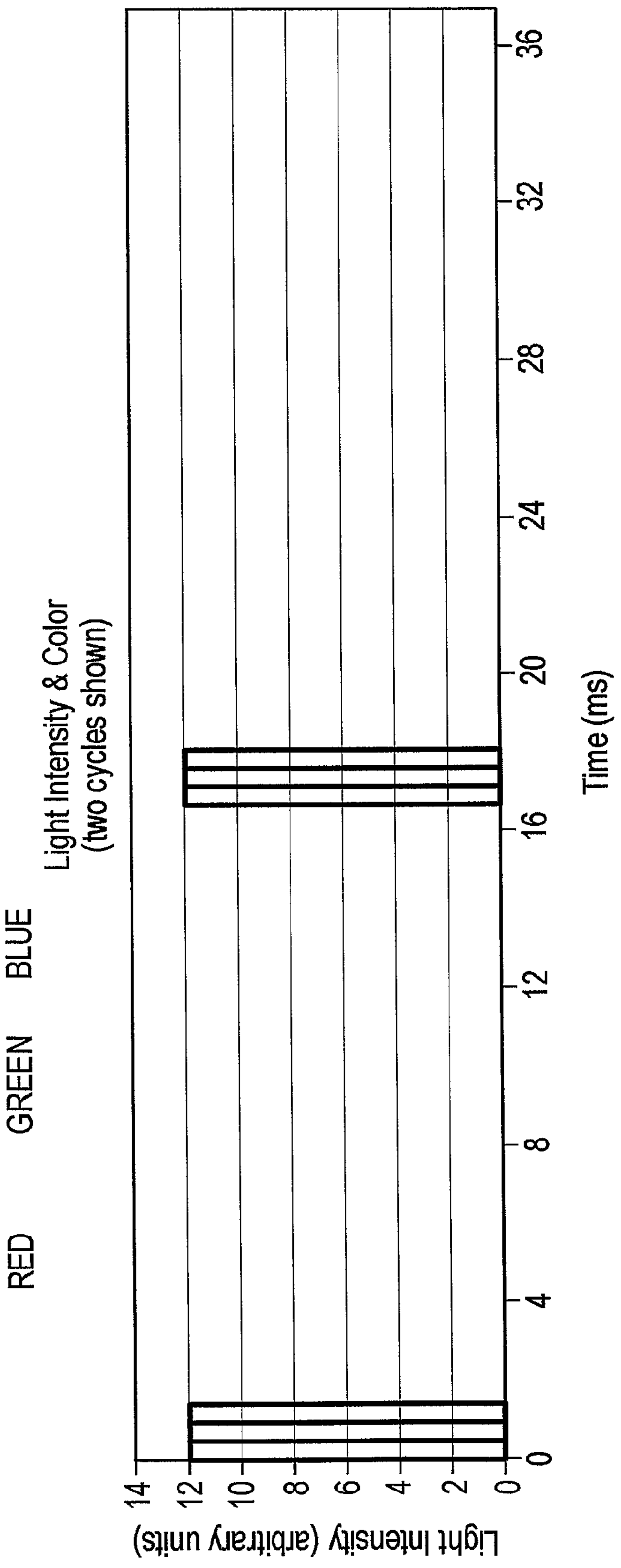
FIG. 12A illustrates a diagram of light intensity versus time in accordance with an embodiment of the present invention.

FIG. 12A illustrates a diagram of light intensity versus time in accordance with an embodiment of the present invention. Referring to FIG. 12A, the light output of the present invention is illustrated in graph 1200, again showing two full cycles as in the previous graph 1101. Likewise, the intensity scale is similar to 1101, so that the relatively longer duration, lower intensity color emissions of the previous art in graph 1101 can be compared with the shorter duration, higher intensity color emissions of the present invention shown in graph 1200.

Figure 12B:
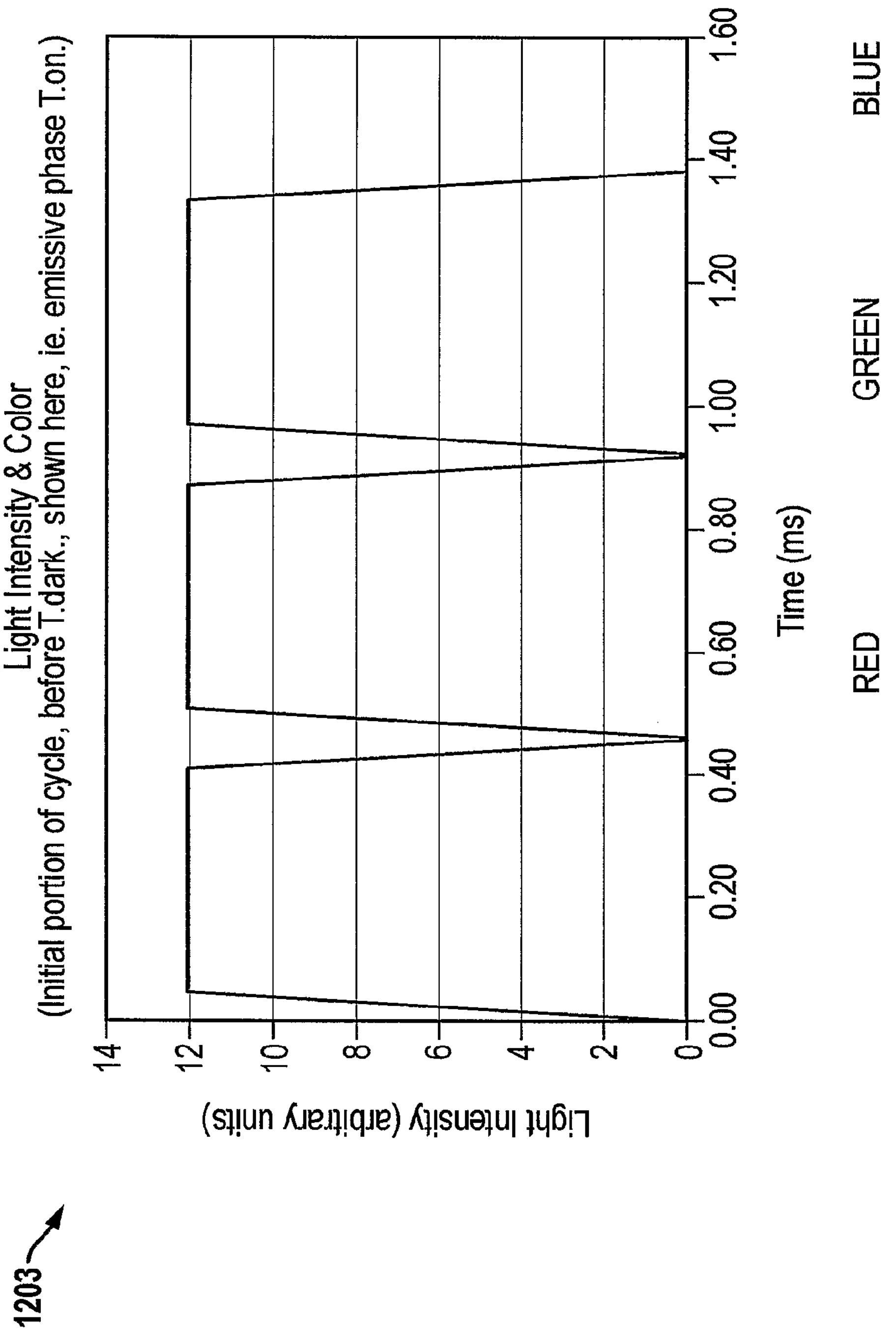
FIG. 12B illustrates a diagram of light intensity versus time showing, in more detail, the beginning of the frame in accordance with an embodiment of the present invention.

FIG. 12B illustrates a diagram of light intensity versus time showing, in more detail, the beginning of the frame in accordance with an embodiment of the present invention. That is, FIG. 12B illustrates the light output of the present invention, but only shows the initial portion of one cycle. More particularly, graph 1203 corresponds in time to only the emissive phase of the present invention. In this embodiment, that emissive phase 1201 is much shorter than a full cycle. The remaining time in the cycle comprises T.dark. 1202, which corresponds specifically to the dark phase previously mentioned as the intended outcome of the opaque portion of color wheel 1005 in FIG. 10B. The numerical values of the light output corresponding to graph 1200, and likewise in part shown in graph 1203, are represented in a tabular fashion in FIG. 12C by table 1204.

It is the object of this invention to advantageously shorten the emissive phase of the cycle, and to create a subsequent dark phase (T.dark.) 1202 wherein no light is emitted. Said dark phase arises as a result of the opaque portion of the color wheel 1005, from FIG. 10B, selectively blocking the light from being emitted. As previously described, the combination of a shortened emissive phase during which all of the cycle's light energy is emitted, and a subsequent dark phase with duration (T.dark.) 1202 during which no light is emitted, results in a much smaller distance between the impact of the different colors on the retina, and therefore dramatically changes the perceived artifacts. Specifically, the distance between subsequent colors within a frame is sufficiently small, such that said distance becomes imperceptible to the viewer and the artifacts are no longer apparent.

A further embodiment of the present invention is comprised of the application of a color wheel filter similar to that found in prior art, as FIG. 10A, wheel 1000, but with said wheel rotating at a higher velocity than that required for matching the timing of one wheel rotation to the duration of a frame. Specifically, the rotation is increased by a whole number, i.e. 2, 3, or greater, such that a plurality of complete rotations are completed during each frame. In this embodiment, a means of interrupting the light source or path, before it emerges from the pixel, is also required. As will be known to one schooled in the art, said means of interruption can be accomplished through several reasonably available mechanisms, including, but not restricted to, a shutter in the light path, a selectable deflective mechanism in the light path, or a switch for the light source where the light first originates.

The unique construction and operation of these commonly available components, that accomplishes the benefits of the present invention, involves interrupting the light flow for all color wheel rotations after the first in a given frame, then removing the interruption to the light path at the start of the next frame, again for exactly one rotation of the color wheel. As this process is repeated, the output from said system makes available a plurality of primary colors, delivered in sequence at the beginning of a frame and lasting only a fraction of the frame's duration, as illustrated in graph 1200 in FIG. 12A. This abbreviated sequence of primary colors, when delivered to a means for pulse width modulation, can then be implemented by one schooled in the art to accomplish the benefits of the present invention.

What is claimed is:

1. A system for displaying a respective image in response to each frame of a field-sequential video signal, the system comprising:

light sources of different primary colors;

a light guide having a light input edge for receiving light of the different primary colors from the light sources and propagating the light in the light guide by total internal reflection; and an array of pixels that are opened and closed by a movable member that deforms under application of an electric field to frustrate the total internal reflection of propagated light in the light guide at defined locations on the light guide according to a predetermined shuttering sequence to output light of the different primary colors from the light guide consecutively in a time of less than 4 milliseconds during the frame of the video signal, and to output no light during the remainder of the frame, the pixels being operable to modulate the light of each primary color output from the light guide in at least one of intensity and pulse width.

2. The system of claim 1, wherein the system is a projection-based field sequential color-based display system.

3. The system of claim 1, wherein the system is a direct-view field sequential color-based display system.

4. The system of claim 1 wherein the pixels are operable to generate gray scale.

5. The system of claim 1, wherein the gray scale generation comprises amplitude intensity modulation.

6. The system of claim 4, wherein the gray scale generation comprises amplitude intensity modulation.

7. The system of claim 1, wherein the light of the different primary colors is cycled synchronously at fixed intervals regardless of program content.

8. The system of claim 1, wherein the light sources that generate the different primary colors are discrete light sources that are independently controlled.

9. The system of claim 8, wherein the light of the different primary colors is cycled asynchronously during the frame according to program content.

10. The system of claim 1, wherein an intensity of the light of the different primary colors is increased by a ratio of 1/n, wherein n is equal to a number of different primary colors output by the light guide.

11. A method for displaying a respective image in response to each frame of a field-sequential video signal, the method comprising:

opening and closing an array of pixels by a movable member that deforms under application of an electric field to frustrate total internal reflection of propagated light of different primary colors in a light guide at defined locations on the light guide according to a predetermined shuttering sequence to output light of the different primary colors from the light guide consecutively in a time of less than 4 milliseconds during the frame of the video signal, and to output no light during the remainder of the frame, and operating the pixels to modulate the light of each primary color output from the light guide in at least one of intensity and pulse width.

12. The method of claim 11, wherein the light guide has a light input edge that receives light of the different primary colors and propagates the light in the light guide by total internal reflection.

13. The method of claim 11 further comprising:

generating gray scale.

14. The method of claim 13, wherein the generating comprises modulating the width of a light pulse.

15. The method of claim 13, wherein the generating comprises modulating the intensity of the light.

16. The method of claim 11 further comprising:

outputting the light of the different primary colors at fixed intervals regardless of program content.

17. The method of claim 11 further comprising:

independently controlling the light of the different primary colors.

18. The method of claim 17 further comprising:

asynchronously outputting the light of the different primary colors during the frame according to program content.

19. The method of claim 11 further comprising:

increasing an intensity of the light by a ratio of 1/n, wherein n is equal to a number of different primary colors output by the light guide.

* * * * *